US012772857B2

(12) United States Patent
Kim et al.

(10) Patent No.: US 12,772,857 B2
(45) Date of Patent: Oct. 20, 2026

(54) METHOD FOR FORMING A SHIELDING LAYER OVER A SEMICONDUCTOR PACKAGE WITH REDUCED METAL BURRS

(71) Applicant: STATS ChipPAC Pte. Ltd., Singapore (SG)

(72) Inventors: ChangOh Kim, Incheon (KR); JinHee Jung, Incheon (KR)

( * ) Notice: Subject to any disclaimer, the term of this patent is extended or adjusted under 35 U.S.C. 154(b) by 341 days.

(21) Appl. No.: 18/633,538

(22) Filed: Apr. 12, 2024

(65) Prior Publication Data

US 2024/0347477 A1 Oct. 17, 2024

(30) Foreign Application Priority Data

Apr. 14, 2023 (CN) ......................... 202310400621.8

(51) Int. Cl.

*H10W 40/20* (2026.01)
*H10W 42/20* (2026.01)
*H10W 74/01* (2026.01)

(52) U.S. Cl.

CPC ........... *H10W 42/20* (2026.01); *H10W 74/01* (2026.01)

(58) Field of Classification Search

CPC ... H10W 42/20; H10W 74/01; H10W 42/276; H10W 74/117; H10W 74/017

See application file for complete search history.

(56) References Cited

U.S. PATENT DOCUMENTS

| | | | | |
|---|---|---|---|---|
| 8,378,466 | B2 | 2/2013 | Chiu et al. | |
| 10,109,593 | B2 | 10/2018 | Lee et al. | |
| 10,797,002 | B2 * | 10/2020 | Nguyen | H10W 42/20 |
| 2023/0170245 | A1 | 6/2023 | Kim et al. | |

* cited by examiner

*Primary Examiner* — David Vu

(74) *Attorney, Agent, or Firm* — Junhe Law Office, P.C.; Yi Zhang

(57) ABSTRACT

A method for forming a shielding layer over a semiconductor package is provided. The method comprises: providing a jig having a metal frame and a carrier tape attached onto the metal frame via an adhesive layer; forming an opening through the adhesive layer and the carrier tape; disposing a semiconductor package on the jig over the opening such that the semiconductor package is supported on and attached to the carrier tape via the adhesive layer; forming a groove in the adhesive layer and around the opening by isotropic etching; forming a shielding layer over the semiconductor package and the jig; and removing the semiconductor package with the shielding layer from the jig.

13 Claims, 8 Drawing Sheets

METHOD FOR FORMING A SHIELDING LAYER OVER A SEMICONDUCTOR PACKAGE WITH REDUCED METAL BURRS

TECHNICAL FIELD

The present invention relates in general to semiconductor technologies and, more particularly, to a method for forming a shielding layer over a semiconductor package with reduced metal burrs.

BACKGROUND OF THE INVENTION

Semiconductor devices are commonly found in modern electronic products, which perform a wide range of functions such as signal processing, high-speed calculations, transmitting and receiving electromagnetic signals, controlling electronic devices, transforming sunlight to electricity, and creating visual images for displays.

Conductive layers such as metal layers are commonly formed over semiconductor packages to shield electronic parts within the semiconductor package from electromagnetic interference (EMI). The package with one or more semiconductor dice and/or several other components are generally encapsulated in an insulating molding compound, and then the conductive layer is sputtered onto the molding compound to form a shielding layer around the components. The shielding layer can absorb EMI before the undesired electromagnetic signals can affect the semiconductor dice and discrete components within the semiconductor package, which might otherwise malfunction. The shielding layers are also formed over the packages with components that are expected to generate EMI to protect nearby devices.

FIGS. 1A and 1B illustrate an existing method for forming a shielding layer over a semiconductor package. As shown in FIGS. 1A and 1B, a semiconductor package 180 includes a package substrate 120. The package substrate 120 has on its lower side conductive patterns 101 and multiple solder bumps 136 electrically connected to the respective conductive patterns 101, and on its upper side a semiconductor die 104 and a discrete device 122 which may be further electrically coupled to the conductive patterns 101 within the package substrate 120. An encapsulant layer 124 is formed on the upper side of the package substrate 120 to encapsulate the semiconductor die 104 and the discrete device 122. The semiconductor package 180 may be placed on a jig 132 to deposit thereon a shielding layer 130. The jig 132 has an opening 134 that facilitates the placement of the semiconductor package 180.

One issue with the existing method is that when the semiconductor package 180 is peeled off the jig 132, a portion 130A, 130B of the shielding layer 130 may remain attached to the package 180 as burrs, as shown in FIG. 1B. Thus, the finished package 180 needs to be machined, brushed, or otherwise processed to remove the remaining burrs. The burr removal process is an extra processing step that requires complicated mechanisms.

Therefore, a need exists for an improved method for forming a shielding layer over a semiconductor package that reduces metal burrs.

SUMMARY OF THE INVENTION

An objective of the present application is to provide a method for forming a shielding layer over a semiconductor package to reduce metal burrs.

In an aspect of the present application, a method for forming a shielding layer over a semiconductor package is provided. The method comprises: providing a jig having a metal frame and a carrier tape attached onto the metal frame via an adhesive layer; forming an opening through the adhesive layer and the carrier tape; disposing a semiconductor package on the jig over the opening such that the semiconductor package is supported on and attached to the carrier tape via the adhesive layer; forming a groove in the adhesive layer and around the opening by isotropic etching; forming a shielding layer over the semiconductor package and the jig; and removing the semiconductor package with the shielding layer from the jig.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF THE DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
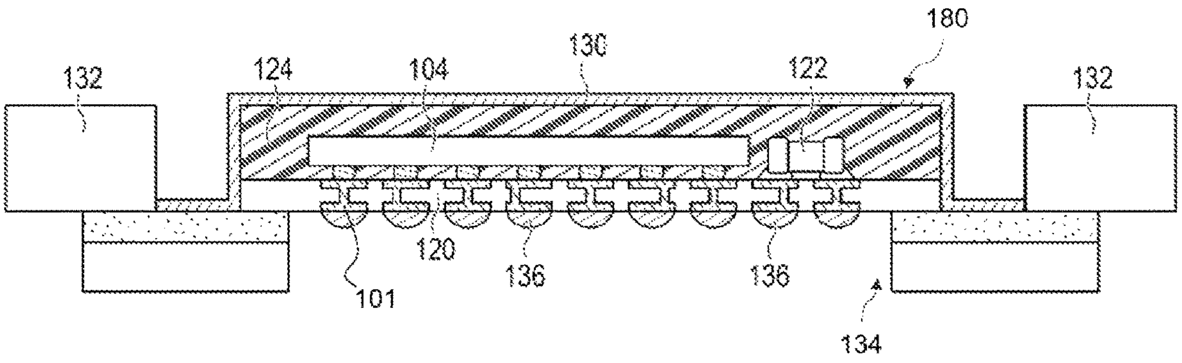
FIG. 1A (PRIOR ART)
FIGS. 1A and 1B illustrate an existing method for forming a shielding layer over a semiconductor package.
Figure 1B:
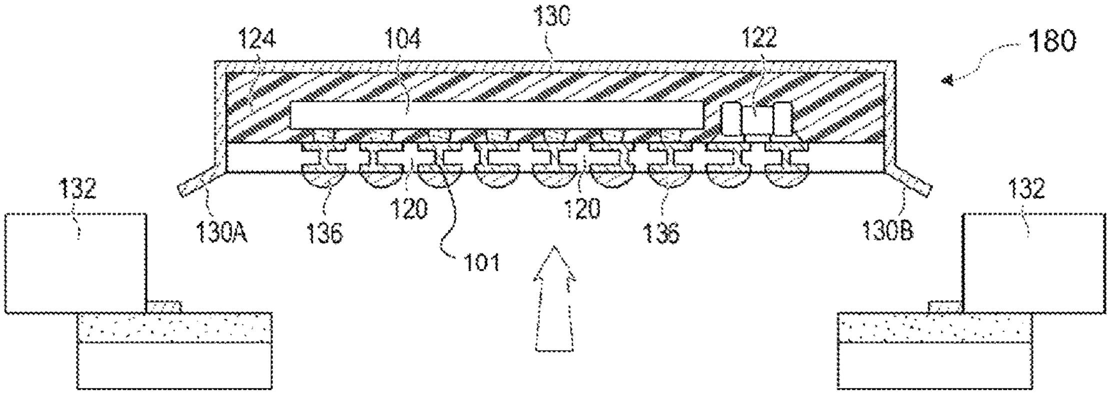
FIG. 1B (PRIOR ART)
Figure 2:
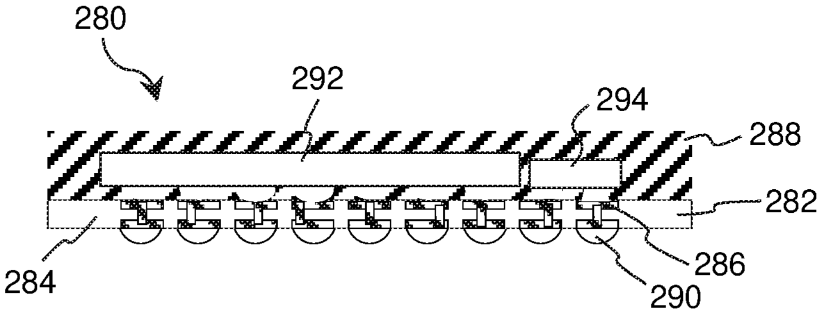
FIG. 2 illustrates a semiconductor package to be formed with a shielding layer according to an embodiment of the present application.

FIG. 2 illustrates a semiconductor package 280 to be formed with a shielding layer according to an embodiment of the present application.

As illustrated in FIG. 2, the semiconductor package 280 includes a package substrate 282 which can be a printed circuit board or another suitable substrate that can support and interconnect various electronic components and at least one electronic component, for example arranged in the form of semiconductor die 292 mounted on the package substrate 282. The package substrate 282 may include at least one insulating layer 284 and various conductive patterns 286 connected to one or more interconnection structures in the package substrate 282. The semiconductor package 280 may further include at least one electronic component for example in the form of discrete electrical device 294 (e.g., a resistor or capacitors). In the embodiment illustrated in FIG. 2, all the electronic components are sealed and encapsulated within an encapsulant layer 288. In a variant, only a part of the electronic components, for example the semiconductor die 292 is sealed within the encapsulant layer 288. In order to avoid or at least reduce the EMI introduced into the semiconductor package 280, a shielding layer is desired to be formed over the encapsulant layer 288, which will be elaborated below.

As aforementioned, existing methods for forming shielding layers over semiconductor packages may produce undesired metal burrs, especially when a continuous shielding layer over the package is peeled off from a carrier such as a tape. The inventors of the present application propose a new process to avoid forming the continuous shielding layer between a semiconductor package and a carrier tape which supports the semiconductor package, thereby metal burrs may not be produced since there is no need to break the shielding layer.

FIG. 3A to FIG. 3E illustrate a method for forming a shielding layer over a semiconductor package according to an embodiment of the present application. For example, the method can be used to form a shielding layer over the semiconductor package 280 shown in FIG. 2.

Figure 3A:
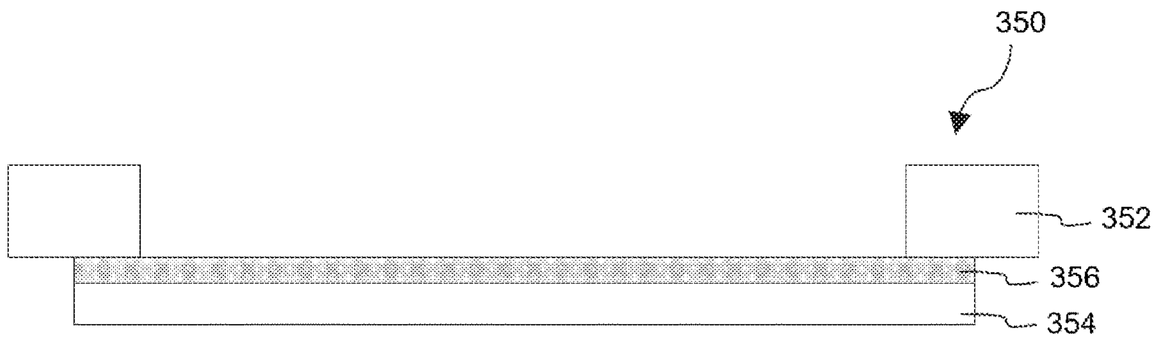
FIGS. 3A-3F illustrate a method for forming a shielded semiconductor package with wet grooving to reduce burrs according to an embodiment of the present application.

As illustrated in FIG. 3A, a jig 350 is provided to attach a semiconductor package (not shown) such as the semiconductor package 280 shown in FIG. 2 to a carrier tape 354. The jig 350 includes a metal frame 352 which defines an opening that allows for the attachment of the semiconductor package. The carrier tape 354 including such as a polyimide (PI) film is attached to the metal frame 352 using an adhesive layer 356, preferably a silicone adhesive layer. The metal frame 352 can be formed from any suitable material, e.g., aluminum or steel. Other types of polymeric or non-polymeric film or tape can be used for the carrier tape 354. The silicone adhesive layer 356 can be isotopically etched in a subsequent process that facilitates the formation of an under-groove, which will be elaborated below. For example, a silicone adhesive etchant SA 300R, which is commercially available from Picomax Co., Ltd., may be used for isotopically etching the silicon adhesive layer 356. SA 300R can remove silicon adhesive without metal damages. The isotopic etching that forms the under-groove or undercut of the silicone adhesive layer is similar as wet etching of a silicon oxide layer under a mask such as a photoresist layer, which removes the silicon oxide material both vertically and horizontally relative to the surface of a substrate.

Figure 3B:
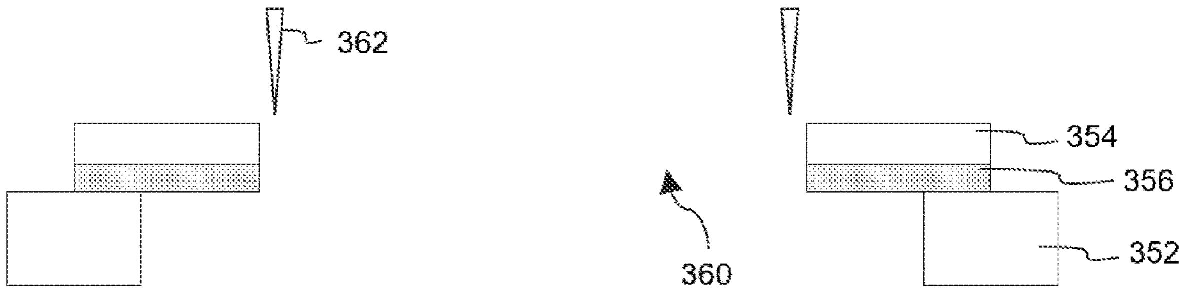

As illustrated in FIG. 3B, an opening 360 is formed through the carrier tape 354 and the adhesive layer 356 using a laser, saw, knife, or other types of cutting tool 362. The opening 360 is sized to have a footprint slightly smaller than the semiconductor package to be processed so that the semiconductor package can lie flat on the carrier tape 354 with any interconnecting structures (such as the conductive pads or solder bumps) of the semiconductor package extending down at least partially through the opening 360. It can be appreciated that while a unit-sized jig 350 with only a single opening 360 is shown, in most embodiments the jig can be large enough to process tens, hundreds, or thousands of units once. In that case, an opening similar as the opening 360 can be formed through the carrier tape 354 for each unit to be processed in parallel.

Figure 3C:
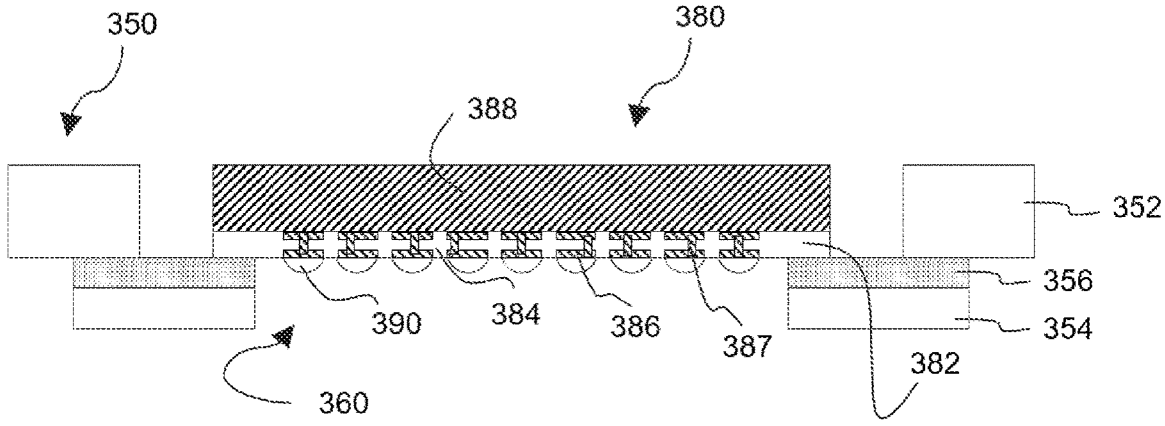

As illustrated in FIG. 3C, a semiconductor package 380 to be shielded is disposed on the jig 350 and covers the opening 360. The semiconductor package 380 has a package substrate 382 including one or more insulating layers 384, which may be interleaved with one or more conductive layers 386. Though only one conductive layer 386 interleaving with one insulating layer 384 is illustrated, the package substrate 382 can include any number of conductive and insulating layers interleaved over each other. The insulating layer 384 is a core insulating board in one embodiment, e.g., a copper-clad laminate substrate, with the conductive layers 386 patterned over the top and bottom surfaces thereof, for example in the form of conductive pads. The conductive layers 386 may also include conductive vias 387 electrically coupled through the insulating layer 384. Any electronic components (not shown) desired to implement the intended functionality of the package 380, for example as illustrated in FIG. 2, can be mounted to or disposed over the package substrate 382 and electrically connected to the conductive layers 386. An encapsulant 388 is deposited over the package substrate 382 and the electronic components mounted thereon. Conductive bumps such as solder bumps 390 are further formed on the contact pads of the conductive layer 386.

It can be seen that edges of the package substrate 382 are attached onto the carrier tape 354 via the adhesive layer 356 remaining on the jig 350. The attachment between the package substrate 382 and the carrier tape 354 provides sufficient support for the entire package substrate 382 such that it can be firmly held in the jig 350 for further processing. In some embodiments, a width of the attachment area between the package substrate 382 and the carrier tap 354 is greater than 50 um, which can ensure the attachment between the package substrate 382 and the carrier tap 354. The width is generally smaller than a clearance between the edge of the package substrate 382 and the solder bumps, that is to say, there is enough space below the package substrate 382 for the attachment.

Figure 3D:
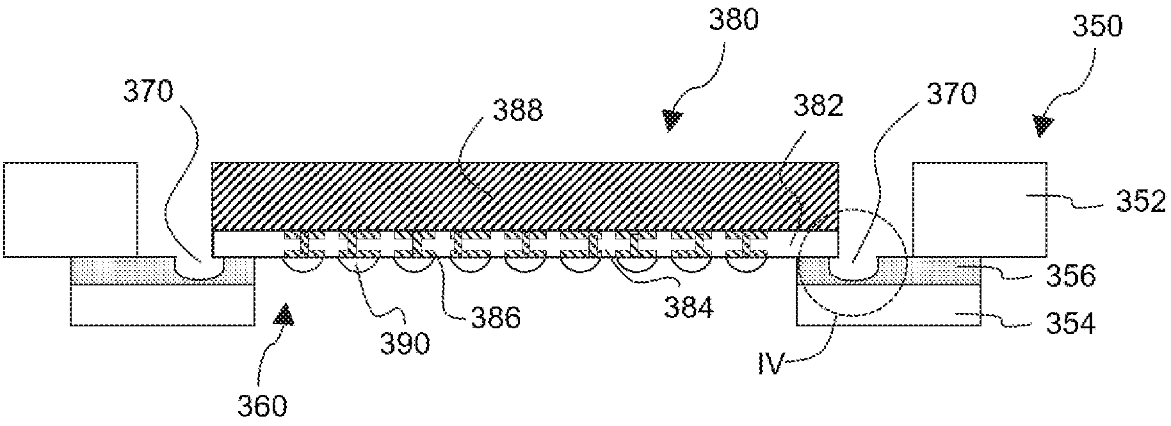
Figure 6:
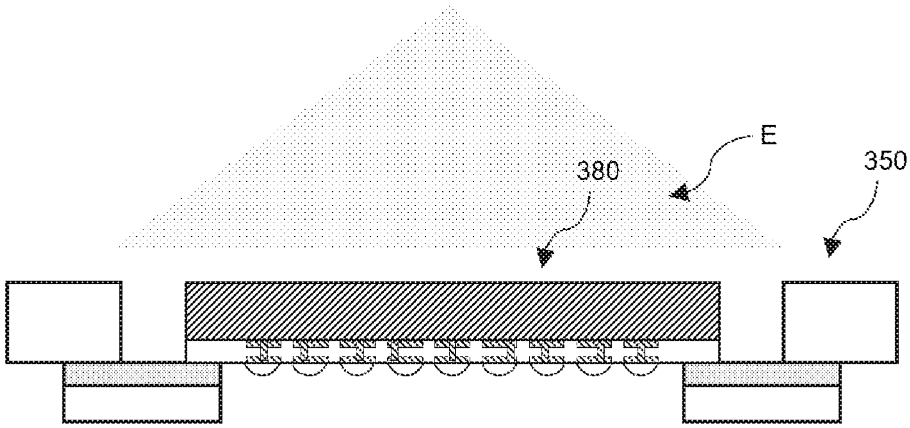
FIGS. 6 and 7 illustrate different embodiments for isotropic etching.
Figure 7:
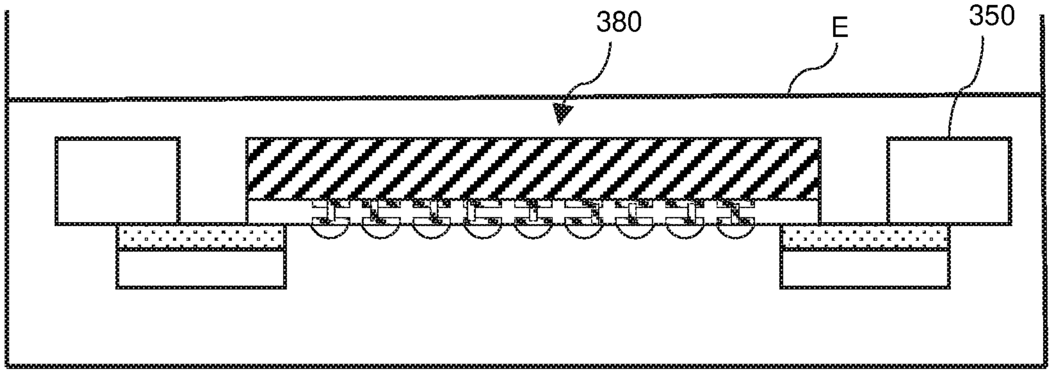

Next, as illustrated in FIG. 3D, grooves 370 are formed in the adhesive layer 356 by isotropic etching, on either side of the semiconductor package 380. The isotropic etching, preferably wet etching, generally uses a chemical solution including an etchant of the adhesive, being a silicone adhesive etchant in the illustrated example. In particular, the isotropic etching may include etching of the Si adhesive layer 356 either by spraying of a silicone adhesive etchant as illustrated in FIG. 6 or by dipping the jig 350 together with the semiconductor package 380 in a silicone adhesive etchant as illustrated in FIG. 7. Since the adhesive layer is etched by the chemical solution and wet etching has isotropic etching behavior, it can remove a portion of the adhesive layer that is in contact with the bottom of the package 382 and close to the edges of the semiconductor package, where intentional backspill can be created later during sputtering as will be further described with regard to FIG. 3E.

Figure 4A:
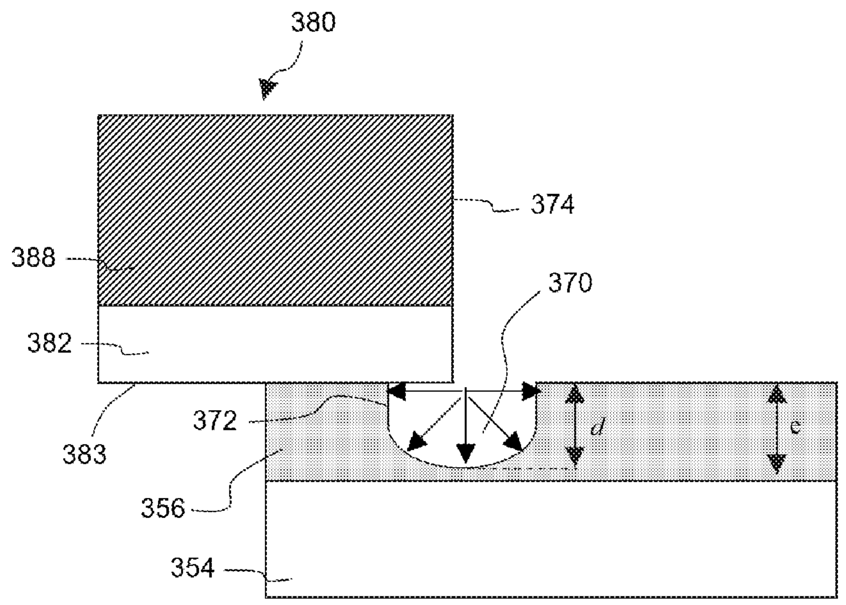
FIG. 4A illustrates an enlarged view of zone IV in FIG. 3D.
Figure 4B:
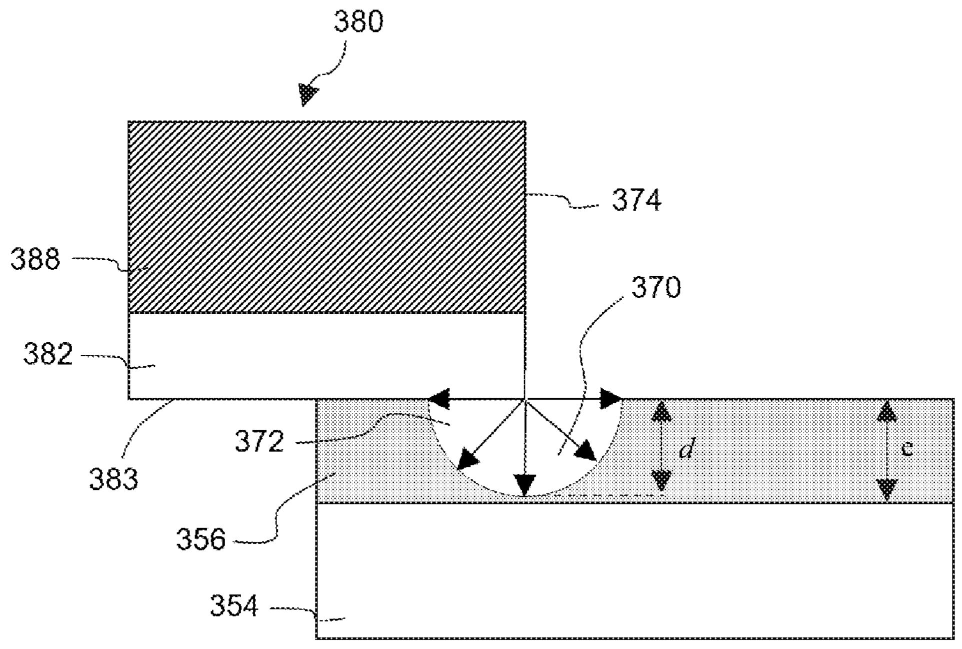
FIG. 4B illustrates a variant example of FIG. 4A.

FIGS. 4A and 4B illustrate enlarged views of zone IV in FIG. 3D in two examples. As can be seen in FIG. 4A, the groove 370 may extend partially and laterally under the package 380. In particular, a portion of an inner wall 372 of the grooves 370 is formed under the package 380. Preferably, the adhesive layer 356 is etched in lateral and downward directions with substantially equal etching distances. Preferably, the adhesive layer 356 may be etched in all directions between the lateral and downward directions with substantially the same etching distance. Further, as illustrated in FIG. 4B, a cross section of the groove 370 may have a substantially semi-circular shape. The depth d of the groove 370 may correspond to the etching distance in the downward direction, and is preferably less than the thickness e of the adhesive layer 356. For example, when the thickness of the adhesive layer is 20 μm, the depth d of the groove 370 is preferably less than 20 μm.

Figure 8:
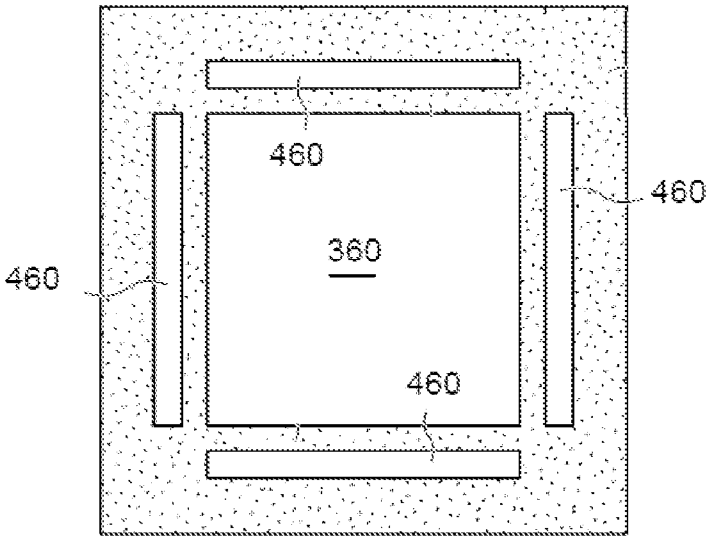
FIG. 8 illustrates a top view of a semiconductor package placed on a jig according to another embodiment of the present invention.

In some embodiments, the groove 370 can either be continuous completely around the opening 360, or the groove 370 can include discrete portions 460 for each side of the opening as shown in FIG. 8. A step of water cleaning and baking can be carried out after the isotropic etching.

Figure 3E:
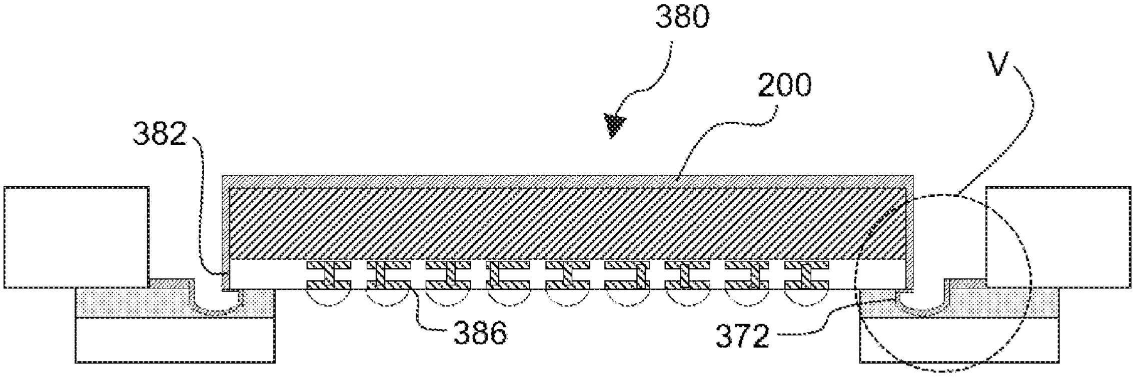

After the isotropic etching process in FIG. 3D, as illustrated in FIG. 3E, a conductive material is sputtered over package 380 to form a conductive shielding layer 200. The sputtered material can be copper, steel, aluminum, gold, combinations thereof, or any other suitable conductive material. In some embodiments, the shielding layer 200 can be formed by sputtering on multiple layers of different materials, e.g., stainless steel-copper-stainless steel or titanium-copper. The shielding layer 200 reduces electromagnetic interference (EMI) between the components of the package 380 and other nearby electronic devices. The shielding layer 200 is optionally grounded through conductive layers 386 exposed at a lateral surface of package substrate 382 to improve EMI reduction.

Figure 5A:
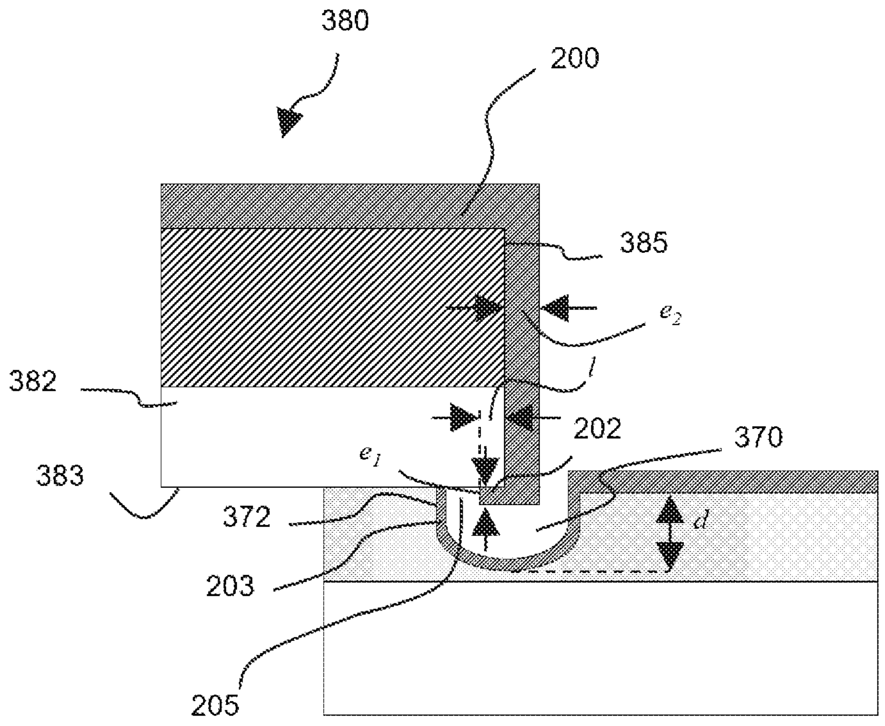
FIG. 5A illustrates an enlarged view of zone V in FIG. 3E.
Figure 5B:
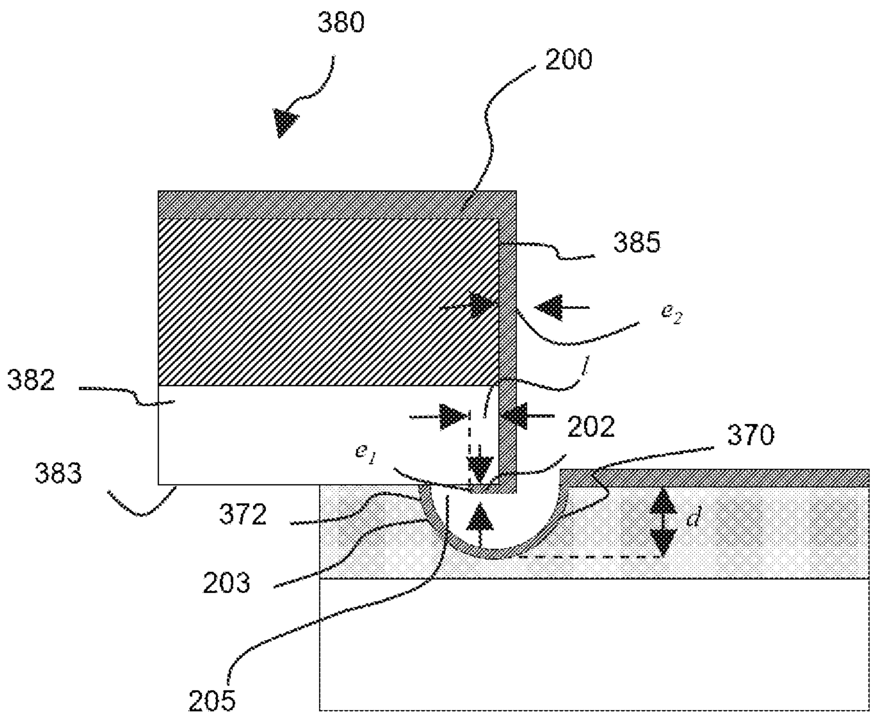
FIG. 5B illustrates a variant example of FIG. 5A.

As can be seen in FIG. 5 illustrating an enlarged view of zone V of FIG. 3E, the shielding layer 200 extends down lateral surfaces 385 of package 380. The shielding layer 200 may extend at least partially under a bottom surface 383 of the package substrate 382. The portion 202 of the shielding layer 200 extending on the bottom surface 383 of the package substrate 382 is referred to as a backspill portion. Preferably, a thickness of the backspill portion 202 of the shielding layer 200 has a thickness e1 that is smaller than a thickness e2 of the shielding layer 200 extending on the lateral surface 385 of package 380. The length l of the backspill portion 202 of the shielding layer 200 is preferably less than the depth d of the groove 370, and in particular, the length l of the backspill portion 202 of the shielding layer 200 is less than 20 μm. The shielding layer 200 may cover entirely the groove 370. Preferably, the shielding layer 200 is discontinuous on the bottom surface 383 of the package substrate 382 as the sputtering process is generally directional, which may not produce too much material rebound from the groove onto the bottom surface 383 of the package substrate 382. As such, the backspill portion 202 of the shielding layer 200 and the portion 203 of the shielding layer 200 deposited in the groove 370 do not combine into a continuous layer of conductive material. A gap 205 is formed between the backspill portion 202 of the shielding layer 200 and the portion 203 of the shielding layer 200 in the groove 370.

Figure 3F:
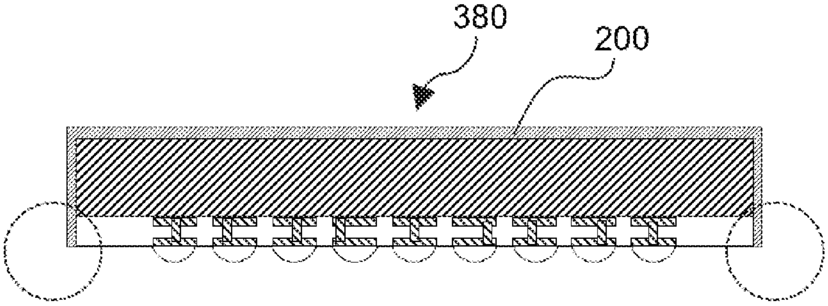

Next, as shown in FIG. 3F, the package 380 with the shielding layer 200 can be removed from jig 350. The shielding layer 200 can break clearly along the horizontal line between the lateral surface 385 and the bottom surface 383 of the package 380 when the package 380 is lifted, thus no burr may be formed to the shielding layer 200.

While the process for forming a shielding layer over a semiconductor package of the present application is described in conjunction with corresponding figures, it will be understood by those skilled in the art that modifications and adaptations to the partial shielded semiconductor device may be made without departing from the scope of the present invention.

The discussion herein included numerous illustrative figures that showed various steps of the method for forming a shielding layer over a semiconductor package. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for forming a shielding layer over a semiconductor package, comprising:

providing a jig having a metal frame and a carrier tape attached onto the metal frame via an adhesive layer;

forming an opening through the adhesive layer and the carrier tape;

disposing a semiconductor package on the jig over the opening such that the semiconductor package is supported on and attached to the carrier tape via the adhesive layer;

forming a groove in the adhesive layer and around the opening by isotropic etching;

forming a shielding layer over the semiconductor package and the jig; and removing the semiconductor package with the shielding layer from the jig.

2. The method of claim 1, further comprising cleaning the jig and the semiconductor package after the step of forming a groove.

3. The method of claim 1, the step of forming a groove further comprising:

forming the groove in a way that the groove extends laterally under the semiconductor package.

4. The method of claim 1, the isotropic etching further comprising:

etching the adhesive layer by spraying of an etchant of the adhesive layer.

5. The method of claim 1, the isotropic etching further comprising:

dipping the jig together with the semiconductor package in an etchant of the adhesive layer.

6. The method of claim 1, wherein a depth of the groove is less than a thickness of the adhesive layer.

7. The method of claim 1, wherein the shielding layer is formed to extend at least partially on a bottom surface of the package substrate.

8. The method of claim 7, wherein a length of a portion of the shielding layer extending on the bottom surface of the package substrate is less than a thickness of the adhesive layer.

9. The method of claim 1, wherein the isotropic etching comprises wet etching.

10. The method of claim 1, wherein the adhesive layer is silicone adhesive layer.

11. The method of claim 1, wherein the groove has a cross section that is of a substantially semi-circular shape.

12. The method of claim 1, wherein the carrier tape comprises a polyimide (PI) film.

13. A semiconductor package which is formed using the method of claim 1.

* * * * *